United States Patent
Kurt

(10) Patent No.: US 7,405,031 B2
(45) Date of Patent: Jul. 29, 2008

(54) LITHOGRAPHIC APPARATUS AND DEVICE MANUFACTURING METHOD

(75) Inventor: Ralph Kurt, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 870 days.

(21) Appl. No.: 10/453,889

(22) Filed: Jun. 4, 2003

(65) Prior Publication Data
US 2004/0043331 A1    Mar. 4, 2004

(30) Foreign Application Priority Data
Jun. 6, 2002    (EP)    ............................... 02253928

(51) Int. Cl.
G03B 27/54 (2006.01)
G03B 27/32 (2006.01)
G03F 7/20 (2006.01)

(52) U.S. Cl. .................... 430/311; 430/5; 355/67; 355/77; 378/34

(58) Field of Classification Search .............. 430/5, 430/311; 250/492.22; 378/34; 355/18, 67
See application file for complete search history.

(56) References Cited

U.S. PATENT DOCUMENTS

| | | | |
|---|---|---|---|
| 5,216,539 A | 6/1993 | Boher et al. | 359/359 |
| 5,958,605 A | 9/1999 | Montcalm et al. | 428/627 |
| 6,134,049 A | 10/2000 | Spiller et al. | 359/590 |
| 6,160,867 A | 12/2000 | Murakami | 378/84 |
| 2003/0222225 A1* | 12/2003 | Shiraishi | 250/492.2 |

FOREIGN PATENT DOCUMENTS

| | | |
|---|---|---|
| EP | 0 632 294 A1 | 1/1995 |
| EP | 0632294 A1 | 1/1995 |
| EP | 1 065 532 A2 | 1/2001 |
| EP | 1065532 A2 | 1/2001 |
| EP | 1 065 532 A3 | 3/2003 |
| JP | 55-120003 | 9/1980 |
| JP | 63-303037 | 12/1988 |
| JP | 3-247743 | 11/1991 |
| WO | WO 00/70373 | 11/2000 |

OTHER PUBLICATIONS

Louis et al., "Enhancement of reflectivity of multilayer mirrors for soft x-ray projection lithography by temperature optimization and ion bombardment," *Microelectronic Engineering* 23:215-218 (1994).

Slaughter et al., "Structure and performance of Si/Mo multilayer mirrors for the extreme ultraviolet," *J. Appl. Phys.* 76(4):2144-2156 (1994).

Slaughter et al., "Structure . . . extreme ultraviolet," J. Appl. Phys. 76 (4), Aug. 15, 1994, pp. 2144-2156.

E. Louis et al., "Enhancement . . . bombardment," Microelectric Eng. 23, 1994, pp. 215-218.

* cited by examiner

*Primary Examiner*—Mark F. Huff
*Assistant Examiner*—Daborah Chacko-Davis
(74) *Attorney, Agent, or Firm*—Pillsbury Withrop Shaw Pittman, LLP

(57) ABSTRACT

A multi-optical-layer optical element of a lithographic projection apparatus in which at least one optical layer is comprised of an alloy of Mo and Cr. That layer may form the outer most layer of a Mo/Si layer system with an optional protective outer coating of Ru. Furthermore, the multi-optical-layer optical element may be comprised of a plurality of interposed between Mo/Cr alloyed layers.

16 Claims, 3 Drawing Sheets

LITHOGRAPHIC APPARATUS AND DEVICE MANUFACTURING METHOD

CROSS REFERENCE TO RELATED APPLICATIONS

This application claims priority from European Patent Application No. EP 02253928.2, filed Jun. 6, 2002, which is incorporated herein in its entirety by reference.

BACKGROUND OF THE INVENTION

1. Field of the Invention

The present invention relates to a lithographic projection apparatus and device manufacturing method.

2. Description of the Related Art

The term "patterning device" as here employed should be broadly interpreted as referring to device that cart be used endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface An alternative embodiment of a programmable mirror array employs a matrix arrangement of tiny minors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam of radiation in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried our on one or more tables while one or more other tables are being used for exposures. Dual stage lithographic apparatus are described, for example, in U.S. Pat. Nos. 5,969,441 and 6,262,796.

Optical elements for use in the extreme ultraviolet (EUV) spectral region, e.g. multi-layered thin film reflectors, are especially sensitive to physical and chemical damage which can significantly reduce their reflectivity and optical quality. Reflectivities at these wavelengths are already low compared to reflectors at longer wavelengths which is a particular problem because a typical EUV lithographic system may have 11 mirrors; four in the illumination optics, six in the imaging optics plus the reflecting reticle. There may also be a number of gracing incidence mirrors. It is therefore evident that even a "small" decrease of 1-2% in the peak reflectivity of a single mirror will cause a significant light through-put reduction in the optical system.

Conventional reflection optics mainly consist of Mo/Si multi-optical-layer optical elements for normal incidence reflection. Such multi-optical-layer optical elements have a theoretical reflectivity of about 73.7% (in practice values are about 69%) if they are Si terminated i.e. the outermost optical-layer is one of Si (not taking account of surface roughness or interfacial diffusion).

A problem exists with such optical elements due to high stresses in the multilayers as a result of large lattice mismatch between the Mo body centred cubic (BCC) crystal structure and that of the Si crystal structure (diamond structure). The stresses or stress relaxation can lead to early failure of the optical element or altering, respectively.

Also, from a theoretical standpoint, a Mo terminated multi-optical-layer optical element has a reflectivity approximately 1 to 1.5% higher than the conventional optical element, if the thickness of the outer Mo layer is 1.5 to 3 nm. However, after manufacturing optical elements, the outer surface is normally exposed to air during the assembly of the lithographic projection apparatus. On exposure to air, the outer Mo layer is completely oxidized and results in a dramatic loss of reflectivity of a few %, thus, to date, only multi-optical-layer optical elements which have an outer layer of Si are in use.

EUV radiation combined with molecular contamination due to water and oxygen (the later might be used for carbon mitigation or cleaning purposes) in the vacuum of an EUV scanner results in a dramatic reduction in the reflectivity of multi-optical-layer optical elements during use in a lithographic projection apparatus. Thus, optical elements have a short lifetime in EUV lithographic apparatus. This reduction in reflectivity, which is a result of oxidation of the outer surface, can occur at pressures as low as $10^{-7}$ mbar of water in the unbaked vacuum used in EUV scanners.

Recently it is has been shown experimentally (see European Patent Application No. EP 1,065,532) that a Ru cap layer as well as a dense packed C cap layer can reduce oxidation and hence also reflectivity loss. However, a thick Ru layer (of about 3 nm) causes an unacceptable reflection loss due to absorption whereas a thin layer (about 1.5 nm) results in intermixing with the layers on which the Ru is coated and therefore oxidation and also reflectivity loss. If a Ru protective outer layer of 1.5 m thickness is used with a 2.0 nm Mo layer, oxidation appears to be prevented for about 50 hours but the theoretical reflectivity of such an optical element is as low as 71.5% i.e. 2-3% lower than the standard Si terminated multi-optical-layer optical element.

SUMMARY OF THE INVENTION

It is an aspect of the present invention to provide optical elements, including a multi-optical-layer mirrors for use in lithographic projection apparatus using extreme ultra violet radiation (EUV) for the projection beam, which have a higher useful lifetime.

This and other aspects are achieved according to the invention in a lithographic apparatus including a radiation system constructed and arranged to supply a beam of radiation; a support constructed and arranged to support a patterning device, the patterning device constructed and arranged to pattern the beam according to a desired pattern; a substrate table constructed and arranged to holding a substrate; and a projection system constructed and arranged to project the patterned beam onto a target portion of the substrate, wherein at least one optical element on which the projection beam is incident has at least one optical layer comprised of an alloy of Mo and Cr.

The optical element may be a beam modifying element such as a reflector, e.g. a multi-optical-layer near-normal incidence mirror or a grazing incidence mirror, included in one of the illumination and projections systems; an intergrator, such as a scattering plate; the mask itself, especially if a multi-optical-layer mask; or any other optical element involved in directing, focusing, shaping, controlling, etc. the projection beam. The optical element may also be a sensor such as an image sensor or a spot sensor.

The optical element of the present invention has surprisingly high reflectivity despite the presence of Cr which is known to be a very efficient absorber material for EUV radiation. The stress due to lattice mismatch which can be generated by depositing a thin Mo layer on Si is reduced because the Cr atoms easily substitute Mo atoms in the Mo crystal. As both Mo and Cr form the body centre cubic (BCC) crystal structure with a lattice constant of 3.15 and 2.88 angstrom respectively, the atom to atom distance of the Mo/Cr alloy is smaller than Mo such that it matches the atom to atom distance of Si layers more closely thereby reducing lattice mismatch stress. Si of course has a tetragonal configuration with a lattice spacing of 5.43 angstrom.

Preferably the at least one optical layer is comprised of between 0.5 and 10 mol % Cr, preferably of between 1-5 mol % Cr and more preferably 3 mol % Cr. It is has been found that such a composition gives a high value of reflectivity whilst reducing stress in the non Si layer.

Preferably the optical element is a multi-optical-layer optical element and the Mo/Cr layer is the outer layer. In this way, the optical element is better protected from chemical attack. Alternatively, the optical element may be a multi-optical-layer optical element which has an outer protective layer of Ru covering the Mo/Cr optical layer. It has been found that with this latter configuration the Mo/Cr optical layer provides a good diffusion barrier between the Si and Ru and thereby enhances corrosion protection when a Ru protective outer layer is used.

Preferably optical layers of the optical element are comprised of a plurality of Mo/Cr optical layers with layers of Si interposed between the Mo/Cr optical layers. In this case the reflectivity is as high as that of a standard Si terminated multi-layer optical element but the stress due to lattice mismatch between the Si layers and the Mo/Cr alloy layers is reduced throughout the element.

Preferably the at least one optical layer is between 1 and 3.5 nm thick, preferably between 1.5 and 3 nm thick. At these thicknesses the reflectivity of the optical element is optimized.

According to a further aspect of the invention there is provided a device manufacturing method including projecting a patterned beam of radiation onto a target portion of a layer of radiation-sensitive material at least partially covering a substrate, wherein at least one optical element on which the beam of radiation is incident has at least one optical layer comprised of an alloy of Mo and Cr.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

In the Figures, corresponding reference symbols indicate corresponding parts.

FIG. 1 schematically depicts a lithographic projection apparatus 1 according to an embodiment of the invention. The apparatus 1 includes a base plate BP; a radiation system Ex, IL constructed and arranged to supply a beam PB of radiation (e.g. EUV radiation), which in this particular case also comprises a radiation source LA; a first object (mask) table MT provided with a mask holder constructed and arranged to hold a mask MA (e.g. a reticle), and connected to a first positioning device PM that accurately positions the mask with respect to a projection system or lens PL; a second object (substrate) table WT provided with a substrate holder constructed and arranged to hold a substrate W (eg. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces a beam of radiation. This radiation is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

Figure 1:
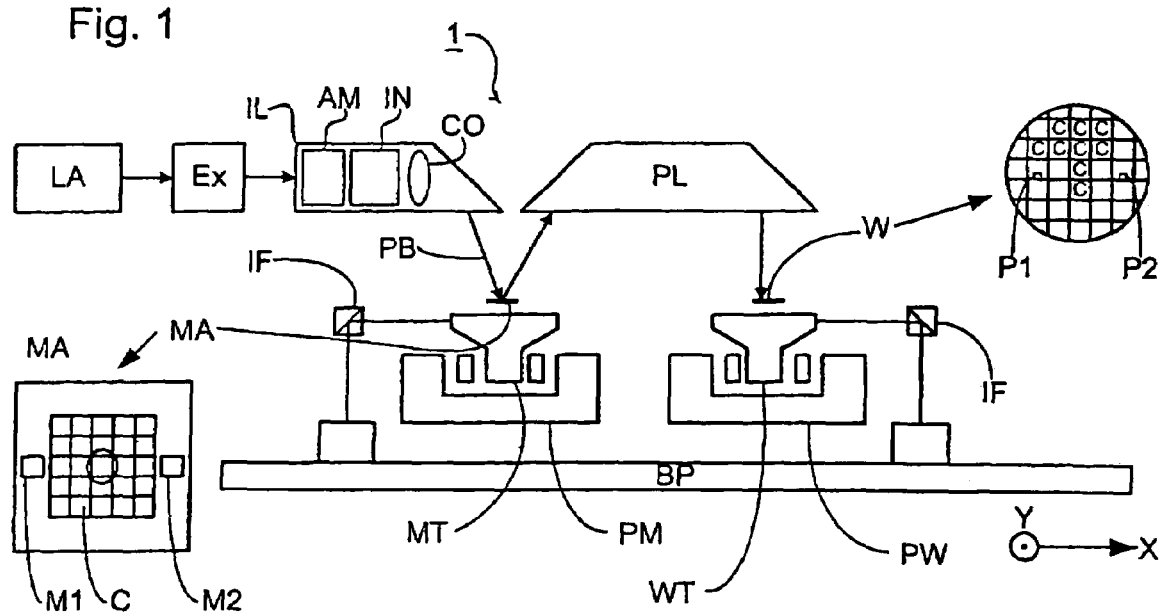
FIG. 1 depicts a lithographic projection apparatus according to an embodiment of the invention.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:
1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g., the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this wanner, a relatively large target portion C can be exposed, without having to compromise on resolution.

The examples of the invention described below are obtained from computations performed using the thin film design program TFCalc (Software Spectra Inc.) and verified using LPro (4D Technology Ltd.). The built-in global and needle optimisation routines of TFCalc were used for the optimisation process, as described in A. V. Tikhonravov, Appl. Opt. 32, 5417 (1993), A. V. Tikhonravov, M. K. Trubetskov and G M. DeBell, Appl. Opt. 35, 5493 (1996) and J. A. Dobrowski and R. A. Kemp, Appl. Opt. 29, 2876 (1990), which references are incorporated herein by reference. The optical constants of the various materials, namely the complex refractive index $N=n-ik$ are derived from atomic scattering factors by Henke et. al. and were obtained from the CXRO web server at Berkeley (B. L. Henke, E. M. Gullikson, and J. C. Davis, Atomic Data and Nuclear Data Tables, 54(2), 181-342 (1993); http://www.cxro.lbl.gov/optical_constants/). The values of n and k for the materials used were downloaded as functions of wavelength from 6 nm to 42 nm and as such the wavelength dependence of n and k is implicit in all calculations. The values of n and k for various materials at some wavelengths of particular interest are tabulated in Table 1 below. To demonstrate the performance enhancement of the reflectors according to the invention, we assume ideal "white" light illumination in the examples below.

Figure 2:
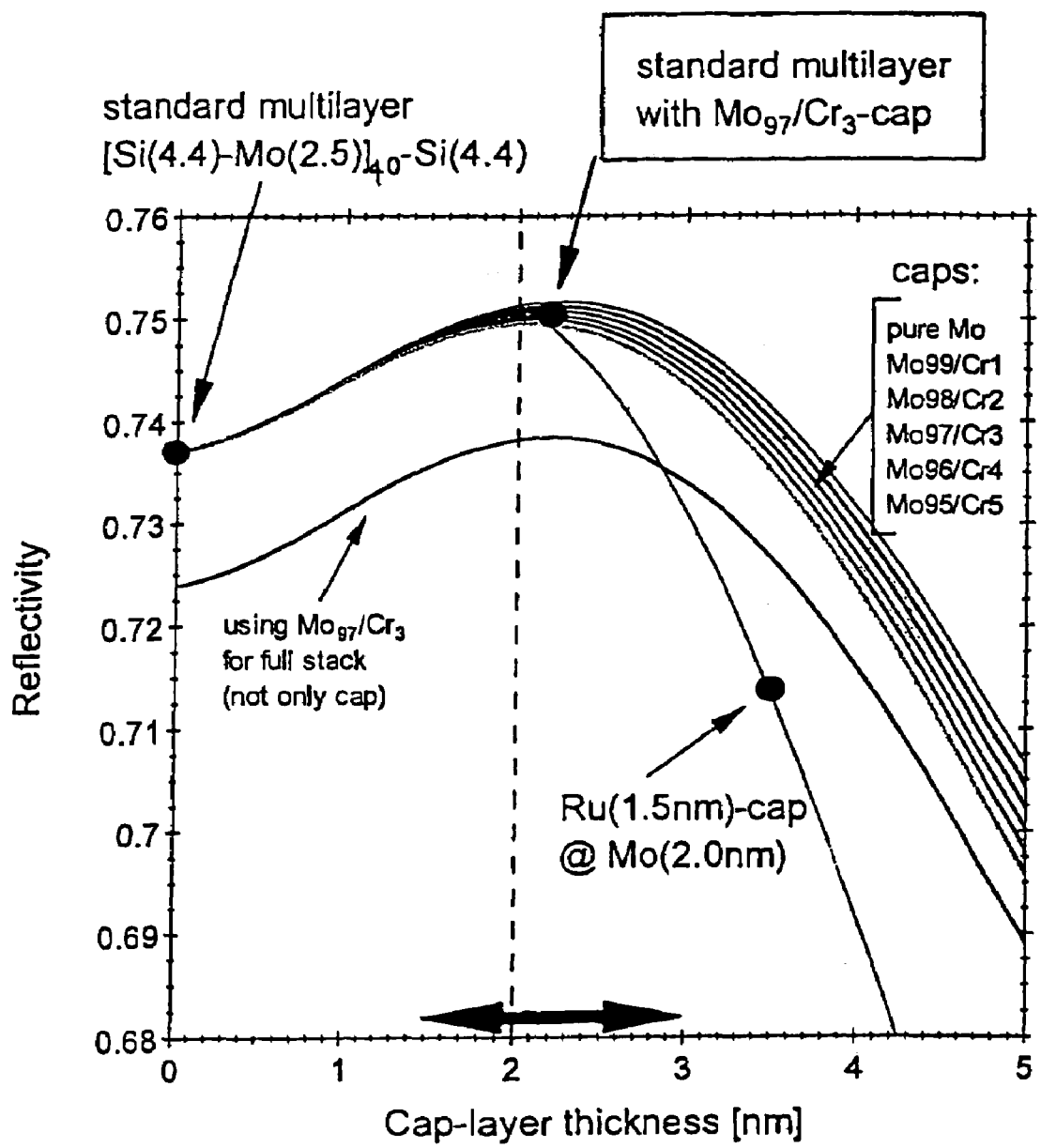
FIG. 2 is a graph of outer layer thickness versus reflectivity for an optical element according to the present invention.

FIG. 2 shows the results of simulations calculating the theoretical reflectivity of a grazing incidence multi-optical-layer optical element. The calculations are performed assuming a projection beam wavelength of 13.5 nm but not taking account of surface roughness or interfacial diffusion. The graph shows the variation in reflectivity with outer layer thickness for a variety of multi-optical-layer optical elements.

The upper set of lines are the results of simulations based on a multi-optical-layer optical element comprising 40 periods of Si/Mo layers grown on a Si substrate. In practice ZERODUR (TM) or other low coefficient of thermal expansion materials such as ULE (TM) are used as the substrate and 40 to 50 periods of Si/Mo are used. The Si layers are 4.4 nm thick and the Mo layers are 2.5 nm thick, and a final outer layer is comprised of Si which has a thickness of 4.4 nm.

The very top line is a comparative example in which the final outer layer of Si is covered in a layer comprised of Mo. This gives the highest reflectivity but, as described above, in practice such an outer layer of Mo would oxidize during assembly of the lithographic projection apparatus giving, in practice, a far lower reflectivity. The five lines below represent cases where the outer layer of Mo is replaced by an alloy of Mo and Cr, with different concentrations of Cr.

The five lines are for five different compositions of alloy ranging from 1 mol % of Cr to 5 mol % of Cr. It can be extrapolated from the trend in the graph that a range of compositions of between 0.5 and 10 mol % Cr would also be effective. The level of Cr in the alloy of the outer most layer should be enough to reduce stress due to lattice mismatch as well as to prevent oxidation of the surface and should be less than an amount which would deleteriously affect the reflectivity.

As can be seen from FIG. 2, the reflectivity of the multi-optical-layer optical element is satisfactory for an outer optical layer comprised of an alloy of Mo and Cr of a thickness between 1 and 3.5 nm thick, preferably between 1.5 and 3 nm thick. The optimum is about 2.25 nm thick.

The advantage gained by having the outer layer comprised of an alloy of Mo and Cr is increased protection of the optical element from chemical and physical attack and reduced stress due to lattice mismatch than a pure Mo layer. Although a decrease in reflectivity is seen over a standard multi-optical-layer optical element comprised with an outer layer of pure Mo, pure Mo outer layers are not used because of their fast degradation in an oxygen of water rich environment. At present, standard multi-optical-layer optical elements have an outer layer of Si which gives a theoretical reflectivity of only 73.7%.

As can be seen from FIG. 2, as well as providing enhanced protection against chemical and physical attack and thereby longer lifetime, an outer layer of an alloy of Mo and Cr also provides a higher maximum theoretical reflectivity than a standard multi-optical-layer optical element comprised of Si and Mo with a Si outer layer.

Furthermore, alloying Mo with Cr reduces its body centered cubic (bcc) lattice constant from about 3.15 angstroms towards 2.88 angstroms which is the lattice constant of the bcc Cr. Such a reduced lattice constant better marches the smaller atom to atom distance of Si which is has a diamond structure with a lattice constant of 5.43 angstroms. This reduction in stress in the Mo layer due to lattice mismatch also leads to a longer lifetime of the optical element. The final advantage mentioned above can be used to good effect throughout the whole of the multi-optical-layer optical element by replacing the Mo layers of the standard multi-optical-layer optical element with an alloy of Mo and Cr. Thus the strains in the Mo layers throughout the whole of the multi-optical-layer optical element are reduced and therefore the lifetime of the optical element can also be expected to be increased. As can be seen from FIG. 2, if theoretical reflectivities for such a system using an alloy of Mo with 3 mol % Cr in place of pure Mo in a Si/Mo system leads to reduced reflectivity over the standard multi-optical-layer optical element with an Mo outer layer but that the reflectivity is still comparable to a standard multi-optical-layer optical element with a Si outer layer.

In the case where the optical element is a grazing incidence mirror (e.g. a collector or an entrance mirror between the illuminator and reticle (PO Box)) a thicker layer of Mo/Cr of between 20 to 100 nm is required. Thus the at least one optical layer is preferably between 1 and 100 nm thick.

As an alternative, an outer layer of Mo alloyed with Cr may be coated at a thickness of about 2 nm. This outer optical layer may be covered with an outer protective layer of Ru with a thickness of about 1.5 nm. It is has previously been found that Ru provides good protection, except that the resistance of Ru to diffusion of gas molecules into the Si of the multi-optical-layer optical element is not particularly high. However, when using Mo alloyed with Cr that layer acts as a better diffusion barrier between the Si and the Ru. Thus, this solution provides excellent corrosion protection at only a small expense of reflectivity.

Figure 3:
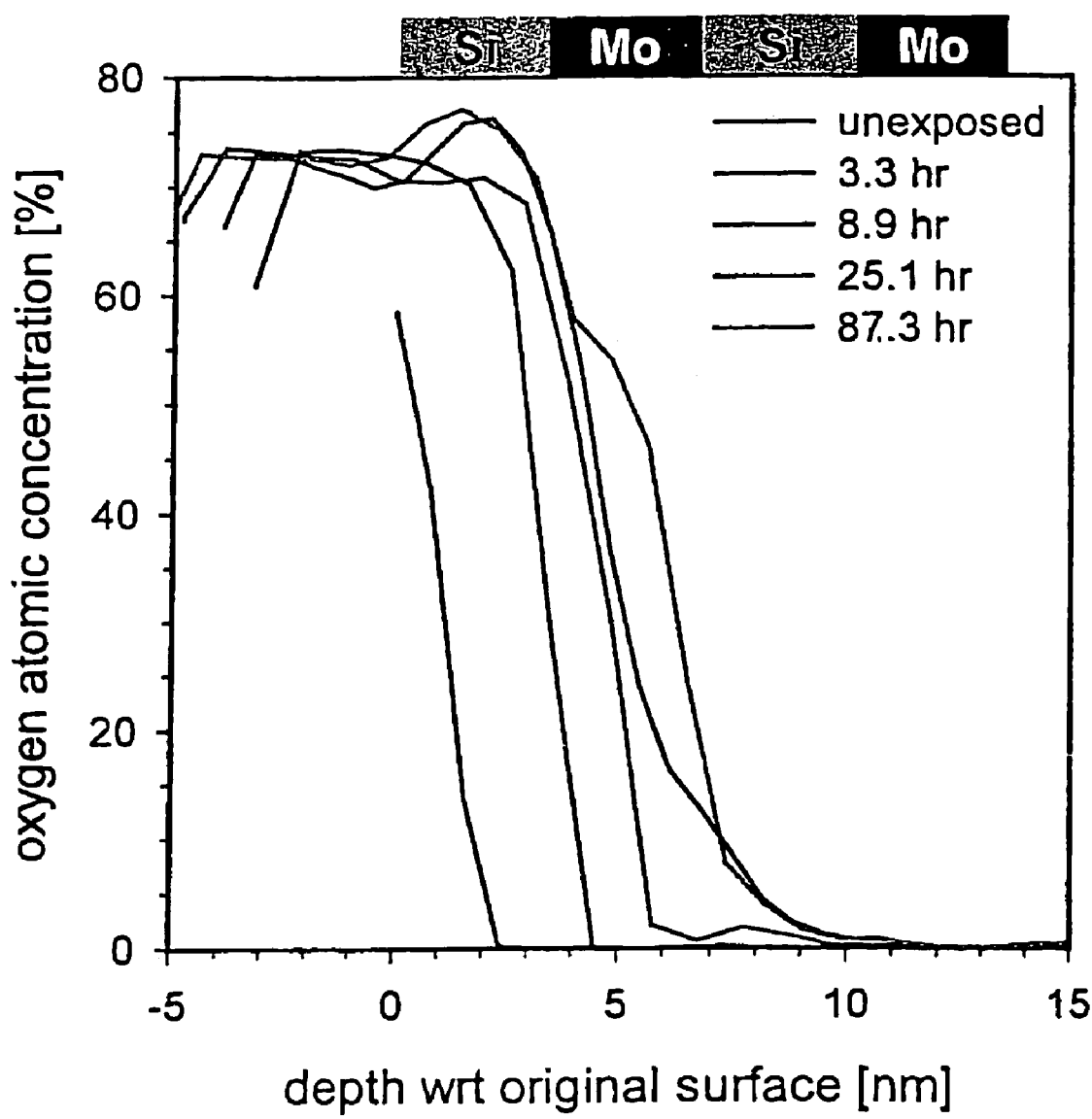
FIG. 3 is a graph of Auger depth profiles of oxygen signal as a function of electron radiation time.

FIG. 3 illustrates Auger depth profiles of the oxygen concentration verses depth of a standard Mo/Si multi-optical-layer optical element. The electron radiation provided at 1.8 mW/mm² with a water pressure of $1 \times 10^{-5}$ mbar. As can be seen, the diffusion of oxygen into the outer Si layer occurs very soon but that oxygen diffusion through the Mo layer is far slower. Thus, with an outer layer of Mo or Mo alloyed with Cr one can expect that the diffusion of oxygen into the multi-optical-layer optical element will be vastly reduced thereby leading to improved lifetime of the optical element.

It will be appreciated that the use of a layer of Mo alloyed with Cr for any of the layers of a multi-optical-layer optical element will be an advantage because of the reduced lattice mismatch between the Mo and Si layers.

Also, it will be appreciated that the present invention is also suitable for use in multi-optical-layer optical elements comprised of optical layers of elements other than Mo and Si. For example, Mo and Rb, Mo and Ru, Ru and Be etc. For other combinations, see EP 1,065,568.

Whilst specific embodiments of the invention have been described above, it will be appreciated that the invention may be practiced otherwise than as described. The description is not intended to limit the invention.

What is claimed is:

1. A lithographic apparatus, comprising:
   a radiation system constructed and arranged to provide a projection beam of radiation;
   a support structure constructed and arranged to support a patterning device, the patterning device constructed and arranged to pattern the projection beam according to a desired pattern;
   a substrate table constructed and arranged to hold a substrate;
   a projection system constructed and arranged to project the patterned beam onto a target portion of the substrate, wherein at least one optical element on which the beam of radiation is incident has at least one optical layer comprised of an alloy of Mo and Cr.

2. An apparatus according to claim 1, wherein the at least one optical layer is comprised of between 0.5 and 10 mol % Cr.

3. An apparatus according to claim 1, wherein the at least one optical layer as comprised of between 1 and 5 mol % Cr.

4. An apparatus according to claim 1, wherein the at least one optical layer is comprised of 3 mol % Cr.

5. An apparatus according to claim 1, wherein the at least one optical element is a multi-optical-layer optical element.

6. An apparatus according to claim 5, wherein the at least one optical layer is the outer layer.

7. An apparatus according to claim 6, wherein the at least one optical layer is covered on a layer of Si.

8. An apparatus according to claim 5, wherein the optical element has an outer protective layer of Ru coated on the at least one optical layer.

9. An apparatus according to claim 8, wherein the outer protection layer of Ru has a thickness of between 0.5 and 2.5 nm.

10. An apparatus according to claim 8, wherein the outer protection layer of Ru has a thickness of 1.5 nm.

11. An apparatus according to claim 5, wherein optical layers of the optical element other than the at least one optical layer are comprised of Si or Mo.

12. An apparatus according to claim 5, wherein optical layers of the optical element are comprised of a plurality of the at least one optical layer with layers of Si interposed between the plurality of the at least one optical layer.

13. An apparatus according to claim 1, wherein the at least one optical layer is between 1 and 3.5 nm thick.

14. An apparatus according to claim 1, wherein the at least one optical layer is between 1.5 and 3 nm thick.

15. An apparatus according to claim 1, wherein the radiation system includes an EUV source constructed and arranged to produce the beam of radiation with a wavelength of between 5 to 20 nm.

16. A device manufacturing method, comprising:
    projecting a patterned beam of radiation onto a target portion of the layer of radiation-sensitive material at least partially covering a substrate, wherein at least one optical element on which the beam of radiation is incident having at least one optical layer comprised of an alloy of Mo and Cr.

* * * * *